United States Patent
Cho

(10) Patent No.: US 7,872,628 B2
(45) Date of Patent: Jan. 18, 2011

(54) SHIFT REGISTER AND LIQUID CRYSTAL DISPLAY DEVICE USING THE SAME

(75) Inventor: Nam Wook Cho, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 903 days.

(21) Appl. No.: 11/296,109

(22) Filed: Dec. 6, 2005

(65) Prior Publication Data

US 2006/0139293 A1   Jun. 29, 2006

(30) Foreign Application Priority Data

Dec. 29, 2004   (KR) .................. 10-2004-0114912

(51) Int. Cl.
*G09G 3/36* (2006.01)
(52) U.S. Cl. ............ 345/100; 345/94; 345/98; 345/99; 345/204; 345/211; 345/212; 345/213
(58) Field of Classification Search ........... 345/92–100, 345/204, 211–213
See application file for complete search history.

(56) References Cited

U.S. PATENT DOCUMENTS

| | | | | |
|---|---|---|---|---|
| 5,633,659 A | * | 5/1997 | Furuhashi et al. ........... 345/173 |
| 7,046,047 B2 | * | 5/2006 | Daijo ........................ 327/99 |
| 7,420,536 B2 | * | 9/2008 | Jang et al. ................... 345/100 |
| 2003/0043944 A1 | * | 3/2003 | Fukuda ....................... 375/354 |
| 2003/0128180 A1 | * | 7/2003 | Kim et al. ................... 345/100 |
| 2003/0189542 A1 | * | 10/2003 | Lee et al. ..................... 345/93 |
| 2003/0231735 A1 | * | 12/2003 | Moon et al. ................. 377/64 |
| 2004/0109526 A1 | * | 6/2004 | Park et al. ................... 377/64 |
| 2004/0113878 A1 | * | 6/2004 | Park ............................ 345/92 |
| 2004/0125069 A1 | * | 7/2004 | Park et al. ................... 345/100 |
| 2004/0181723 A1 | * | 9/2004 | Nakao et al. ................ 714/726 |
| 2004/0239608 A1 | * | 12/2004 | Chung ........................ 345/100 |

* cited by examiner

*Primary Examiner*—Alexander Eisen
*Assistant Examiner*—Viet Pham
(74) *Attorney, Agent, or Firm*—Brinks Hofer Gilson & Lione

(57) ABSTRACT

A shift register and an LCD device to prevent the deterioration of a transistor by controlling a bias stress are disclosed. The shift register includes a plurality of stages for sequential shift signals, wherein each of the plurality of stages is connected with first and second supplying voltage input lines having opposite phases inversed by at least every frame, a start pulse input line, and at least one clock signal input line in which a phase of a first logic state is shifted in sequence, and a clock signal inputted to the clock signal input line is maintained in a second logic state different from the first logic state during a blanking time between frames.

9 Claims, 11 Drawing Sheets

SHIFT REGISTER AND LIQUID CRYSTAL DISPLAY DEVICE USING THE SAME

This application claims the benefit of the Korean Patent Application No. P2004-114912 filed on Dec. 29, 2004, which is hereby incorporated by reference as if fully set forth herein.

BACKGROUND OF THE INVENTION

1. Field of the Invention

The present invention relates to a shift register and a liquid crystal display (LCD) device using the shift register, to prevent a bias stress applied to a transistor, thereby preventing the transistor from being deteriorated.

2. Discussion of the Related Art

A Cathode Ray Tube (CRT), one of flat display devices, has been widely used for monitors of a television, a measuring machine and an information terminal. However, the CRT has limitations regarding both its size and weight. Accordingly, display devices such as a liquid crystal display (LCD) device, a field emission display (FED), a plasma display panel (PDP), and a light emitting display (LED) have been actively studied, which can substitute for the CRT.

The LCD device includes an LCD panel for displaying a picture image, and a driving circuit for applying a driving signal to the LCD panel.

The LCD panel includes a plurality of gate and data lines, wherein each of the gate lines is perpendicular to each of the data lines, to define a plurality of pixel regions which are provided with liquid crystal cells. The respective liquid crystal cells include pixel electrodes and common electrodes. The pixel electrodes are connected with any one of the data lines through source and drain terminals of thin film transistors which function as switching devices. Also, the gate terminal of the thin film transistor is connected with any one of the gate lines.

The driving circuit is comprised of a gate driver for driving the gate lines, and a data driver for driving the data lines. The gate driver sequentially supplies scan pulses to the gate lines, whereby the liquid crystal cells of the LCD panel are driven in sequence. The data driver supplies video signals to the data lines whenever the scan pulse is provided to any one of the gate lines. Accordingly, the LCD device displays images by controlling light-transmittance with an electric field applied between the pixel electrode and the common electrode according to the video signal applied to each of the liquid crystal cells.

The gate driver of the driving circuit uses a shift register so as to generate the scan pulses for sequentially driving the gate lines. Also, the data driver uses a shift register so as to generate sampling signals for sequentially sampling the inputted video signals by each clock. If the gate and data drivers, having the shift registers, are formed of polysilicon, they are mounted on the LCD panel.

FIG. 1 is a schematic view of showing a shift register according to the related art.

As shown in FIG. 1, a shift register according to the related art is comprised of 'n' stages ST1 to STn, which are connected with gate start pulse input lines, for receiving three clock signals among four clock signals C1 to C4. The first to fourth clock signals C1 to C4 are phase-delayed by each clock, and then are supplied through the respective input lines in the order of C4, C1, C2 and C3. Also, a gate start pulse GSP is supplied in synchronization with the fourth clock signal C4 by each frame.

The first stage ST1 outputs a first output signal S01 using the gate start pulses and the three clock signals among the four clock signals C1 to C4. Then, the second to n-th stages ST2 to STn, respectively, output second to n-th output signals S02 to S0n using the output signal S01 to SO(n–1) outputted from the prior stage ST1 to ST(n–1) and the three clock signals among the four clock signals C1 to C4. That is, the first to n-th stages ST1 to STn sequentially output the first to n-th output signals S01 to S0n of which phases are shifted.

The first to n-th output signals S01 to S0n may be used with the scan pulses for sequentially driving the gate lines of the LCD panel, or may be used with the sampling signals for sequentially sampling the video signals of the data driver.

FIG. 2 is a circuit view showing the first stage ST1 of FIG. 1. Referring to FIG. 2, the first stage ST1 is comprised of a first controller 32, a second controller 34, and an output buffer 36. The first controller 32 controls a first node Q according to the fourth clock signal C4 and the gate start pulse GSP. The second controller 34 controls a second node QB according to the third clock signal C3 and the gate start pulse GSP. Also, the output buffer 36 selectively outputs any one of the first clock signal C1 and a first supplying voltage VSS according to the voltages of the first and second nodes Q and QB.

The first controller 32 includes a first transistor T1, a second transistor T2, and a third transistor T3. In detail, the first transistor T1 of a diode type is connected with the gate start pulse input line. The second transistor T2 is connected with the first transistor T1, the fourth clock signal input line, and the first node Q. The third transistor T3 is connected with the second transistor T2, the first supplying voltage VSS, and the second node QB.

The second controller 34 includes a fourth transistor T4, and a fifth transistor T5. At this time, the fourth transistor T4 is connected with the second supplying voltage VDD input line, the third clock signal C3 input line, and the second node QB. The fifth transistor T5 is connected with the second node QB, the gate start pulse GSP input line, and the first supplying voltage VSS input line.

The output buffer 36 includes a sixth transistor T6, and a seventh transistor T7. At this time, the sixth transistor T6 selectively supplies the first clock signal C1 to the output line according to the voltage of the first node Q. The seventh transistor T7 selectively supplies the first supplying voltage VSS to the output line according to the second node QB. The seventh transistor T7 operates with the third transistor T3 of the first controller 32 according to the voltage of the second node QB.

As shown in FIG. 1, the first, third and fourth clock signals C1, C3, and C4 are supplied to the first stage ST1. In FIG. 3, the gate start pulse GSP and the first to fourth clock signals C1 to C4 are supplied in a positive type which has a swing voltage of about 25V, at least above 10V. Supposing that a potential of 17V is in a high state, a potential of –8V is in a low state, the first supplying voltage VSS applied to the first stage ST1 is about –8V, and the second supplying voltage VDD is about 17V.

An operation of the fist stage ST1 will be explained with reference to the driving waveform. During a period of 't1', the gate start pulse GSP and the fourth clock signal C4 are in the high state, whereby the first and second transistors T1 and T2 are turned-on, and the first node Q is in a first high state H1. Accordingly, the sixth transistor T6 having the gate terminal connected with the first node Q is turned-on slowly. Thus, the third and seventh transistors T3 and T7 having the gate terminals connected with the second node QB are turned-off. In the period of 't1', the first clock signal C1 of low state is supplied to the output line of the first stage ST1 through the sixth transistor T6.

During a period of 't2', the gate start pulse GSP and the fourth clock signal C4 are in the low state, whereby the first clock signal C1 is in the high state. Thus, the first and second transistors T1 and T2 are turned-off, so that the sixth transistor T6 is turned-on. The first node Q is a floating state as the first and second transistors T1 and T2 are turned-off. Thus, the first node Q is bootstrapping according to the high-state voltage of the first clock signal C1 by a parasitic capacitance Cgs, generated between the gate and source terminals of the sixth transistor T6. Accordingly, the first node Q is in a second high state H2 which is higher than the first high state H1, whereby the sixth transistor T6 is turned on. As a result, the first clock signal C1 of the high state is supplied to the output line of the first stage ST1. Accordingly, the first stage ST1 outputs the output signal S01 of the high state.

During a period of 't3', the first clock signal C1 is in the low state, and the second clock signal C2 is in the high state, wherein the voltage of the first node Q of the floating state is switched to the first high state H1, and the sixth transistor T6 is maintained in the turning-on state. Accordingly, the first stage ST1 outputs the first clock signal C1 of the low state through the sixth transistor T6, in which the first clock signal is outputted as the output signal S01.

During a period of 't4', the third clock signal C3 is in the high state, whereby the fourth transistor T4 is turned-on. Thus, the second supplying voltage VDD is supplied to the second node QB. Accordingly, the third and seventh transistors T3 and T7 are turned-on at the same time. That is, the first supplying voltage VSS is supplied to the first node Q through the third transistor T3. The sixth transistor T6 is turned-off using the first supplying voltage VSS supplied to the first node Q. As a result, the first stage ST1 outputs the first supplying voltage VSS through the seventh transistor T7.

During a period of 't5', only the fourth clock signal C4 is in the high state, whereby the second transistor T2 is turned-on, and the first, fourth and fifth transistors T1, T4 and T5 are turned-off. Accordingly, the first and second nodes Q and QB are floating, whereby the first and second nodes Q and QB are maintained in the prior state. Thus, in the period of 't5', the third and seventh transistors T3 and T7 are turned-on, whereby the output signal S01 of the first stage ST1 outputs the first supplying voltage VSS in the same manner as the period 't4'.

Meanwhile, the second to n-th stages receive the output signals outputted from the prior stages ST1 to ST(n−1) as the gate start pulse GSP, and also receives three clock signals among the first to fourth clock signals C1 to C4, and then outputs the output signals S02 to S0n. That is, the second to n-th stages are operated in the same method as the first stage ST1.

Among the transistors of the respective stages ST1 to STn, the third and seventh transistors T3 and T7 are operated according to the voltage of the second node QB. That is, when driving the third and seventh transistors T3 and T7, a bias stress is applied to the third and seventh transistors T3 and T7. That is, the bias stress is applied to the third and seventh transistors T3 and T7 except during the period of outputting the high-state signal in one frame.

The third and seventh transistors T3 and T7 are deteriorated due to the bias stress. Accordingly, as shown in FIG. 4A, if a positive bias stress is applied to the third and seventh transistors T3 and T7, the output-current characteristics are shifted to the right side according to the gate voltage. That is, as the output-current characteristics are shifted to the right side according to the gate voltage, the gate voltage must be increased in order to output the same-level current.

Meanwhile, as shown in FIG. 4B, if a negative bias stress is applied to the third and seventh transistors T3 and T7, the output-current characteristics are shifted to the left side according to the gate voltage. That is, as the output-current characteristics are shifted to the left side according to the gate voltage, the gate voltage must be increased in order to output the same-level current.

Also, the first to fourth clock signals C1 to C4 are sequentially applied to the respective stages ST1 to STn without regard to the frame. Thus, the third and seventh transistors T3 and T7 may deteriorate due to the bias stress by the clock signals C1 to C4.

To prevent the deterioration of a transistor, it is necessary to prevent the bias stress from being applied to the third and seventh transistors T3 and T7, which are connected with the second node QB of the respective stages ST1 to STn.

SUMMARY OF THE INVENTION

Accordingly, the present invention is directed to a shift register and an LCD device using the same. A shift register includes a plurality of stages for sequentially shifting signals. Each of the plurality of stages is connected with first and second supplying voltage input lines having opposite phases inversed by at least every frame, a start pulse input line, and at least one clock signal input line in which a phase of a first logic state is shifted in sequence. A clock signal inputted to the clock signal input line is maintained in a second logic state different from the first logic state during a blanking time between frames.

In another aspect of the present invention, an LCD device includes an LCD panel including liquid crystal cells in pixel regions defined by a plurality of gate and data lines. A data driver for supplying data to the data lines and a gate driver including a plurality of stages are included. Each of the stages are connected with a start pulse input line. A clock signal input line for sequentially shifting phases of a first logic state, generates scan pulses for driving the gate lines. A timing controller controls the data driver and the gate driver, and generates a clock mask signal corresponding to a blanking time between frames. The clock signal is maintained in a second logic state different from the first logic state during the blanking time according to the clock mask signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

Hereinafter, a shift register and an LCD device using the same according to the present invention will be described with reference to the accompanying drawings.

Figure 1:
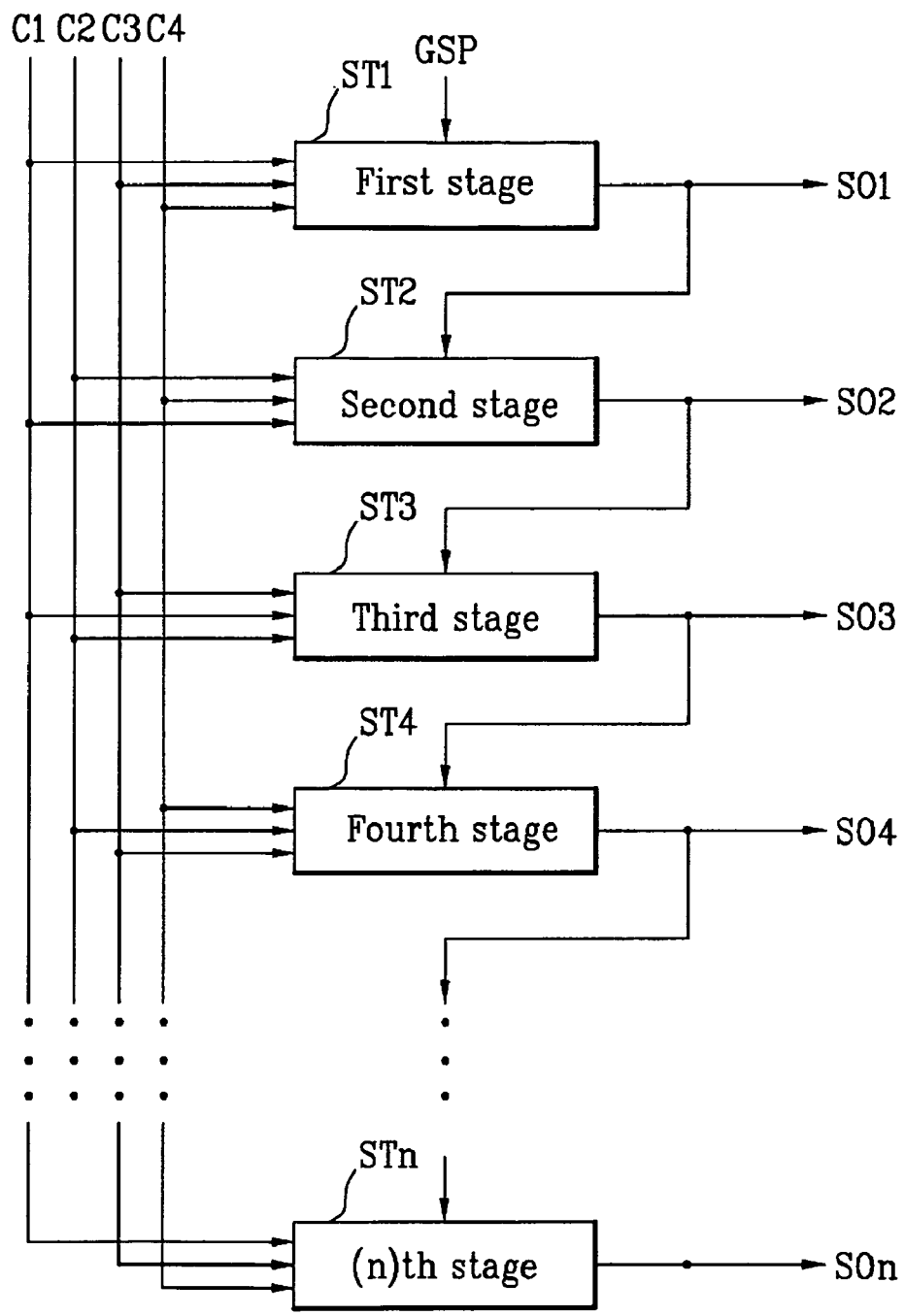
FIG. 1 is a schematic view of showing a shift register according to the related art.
Figure 2:
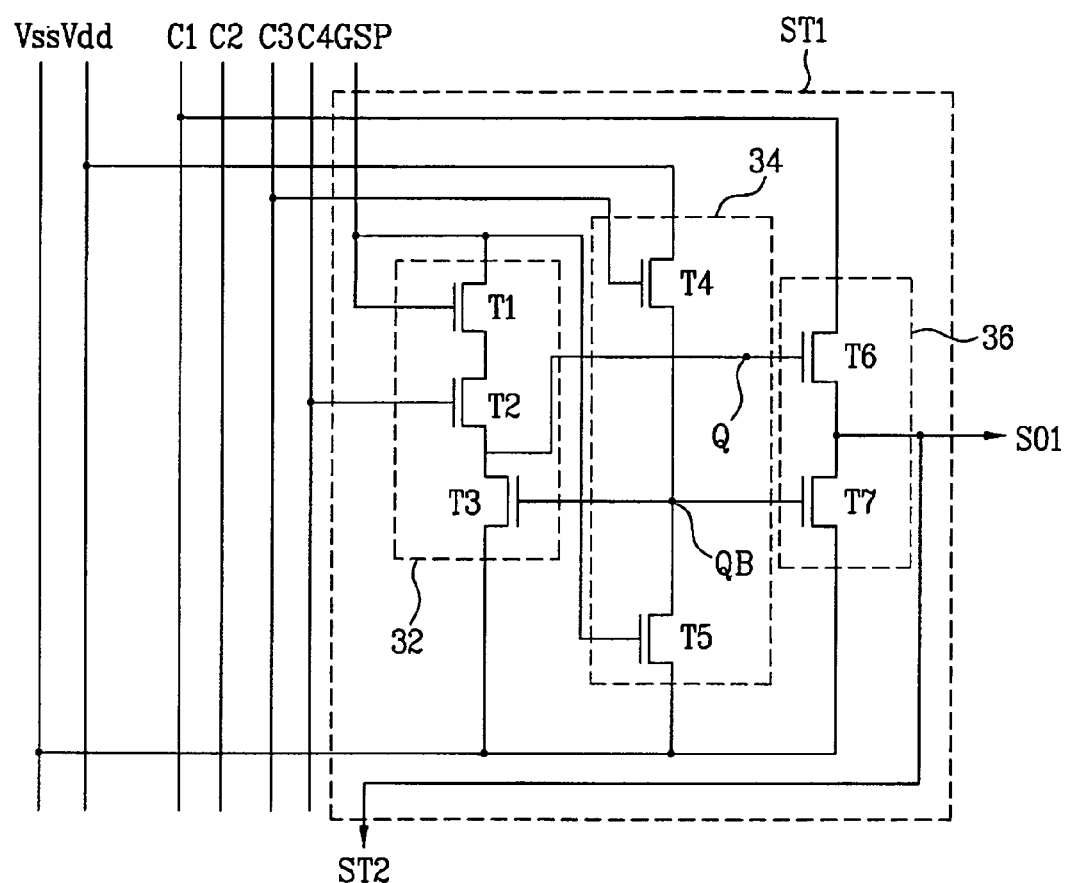
FIG. 2 is a circuit view of showing a first stage in a shift register of FIG. 1.
Figure 3:
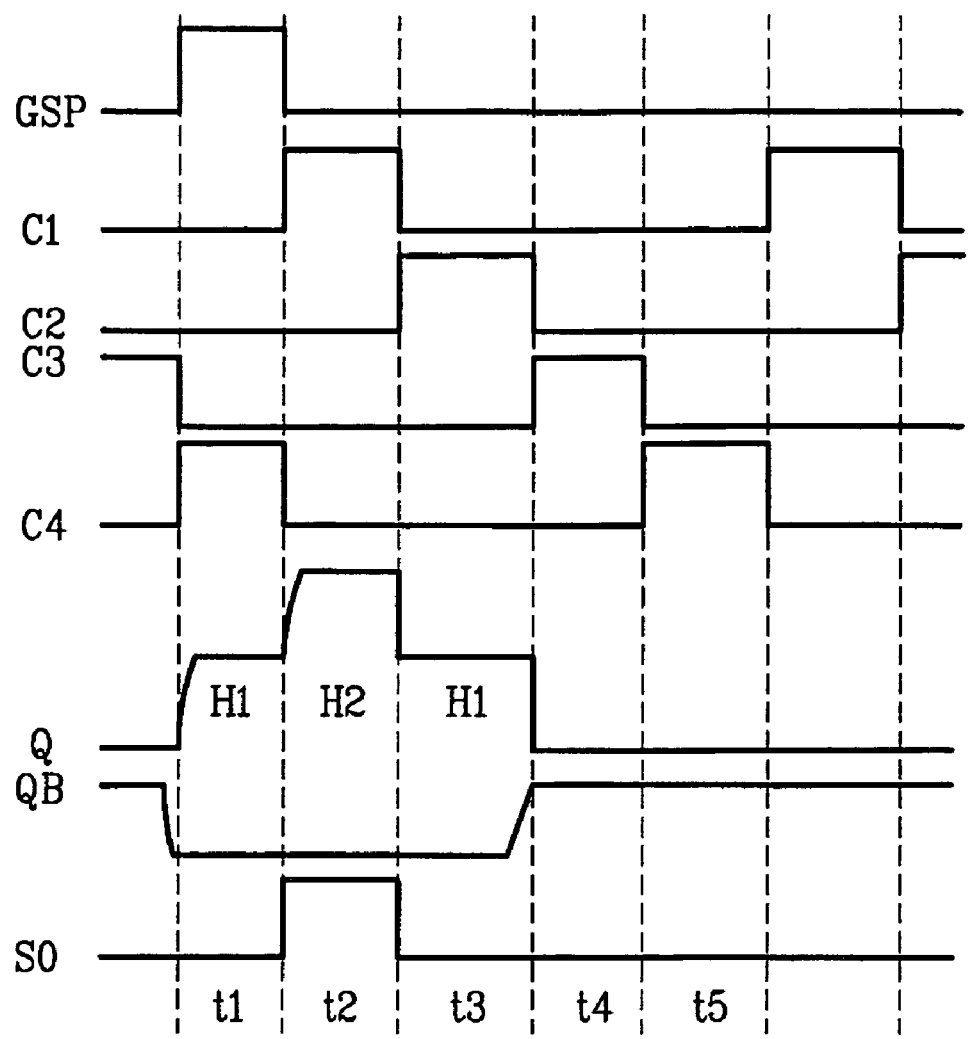
FIG. 3 is a waveform view of showing a driving waveform and an output signal.
Figure 4A:
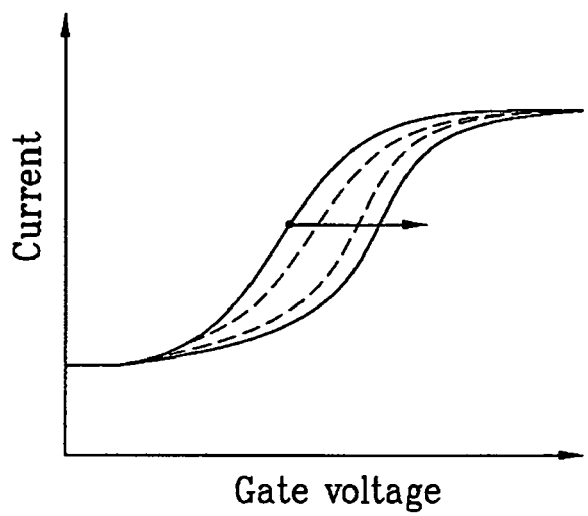
FIG. 4A is a waveform view of showing a change of characteristics of a transistor generated by a positive bias stress.
Figure 4B:
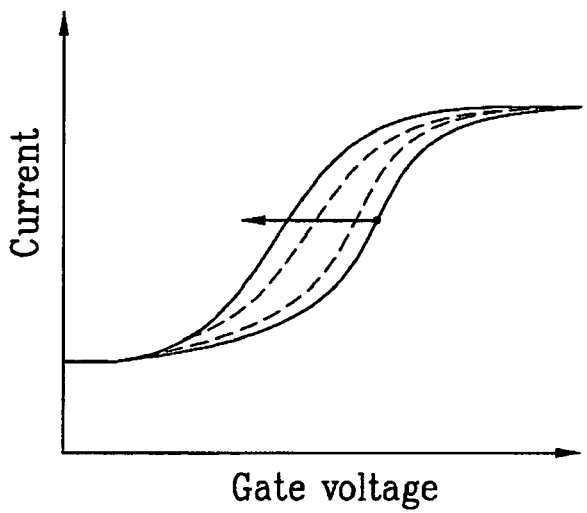
FIG. 4B is a waveform view of showing a change on characteristics of a transistor generated by a negative bias stress.
Figure 5:
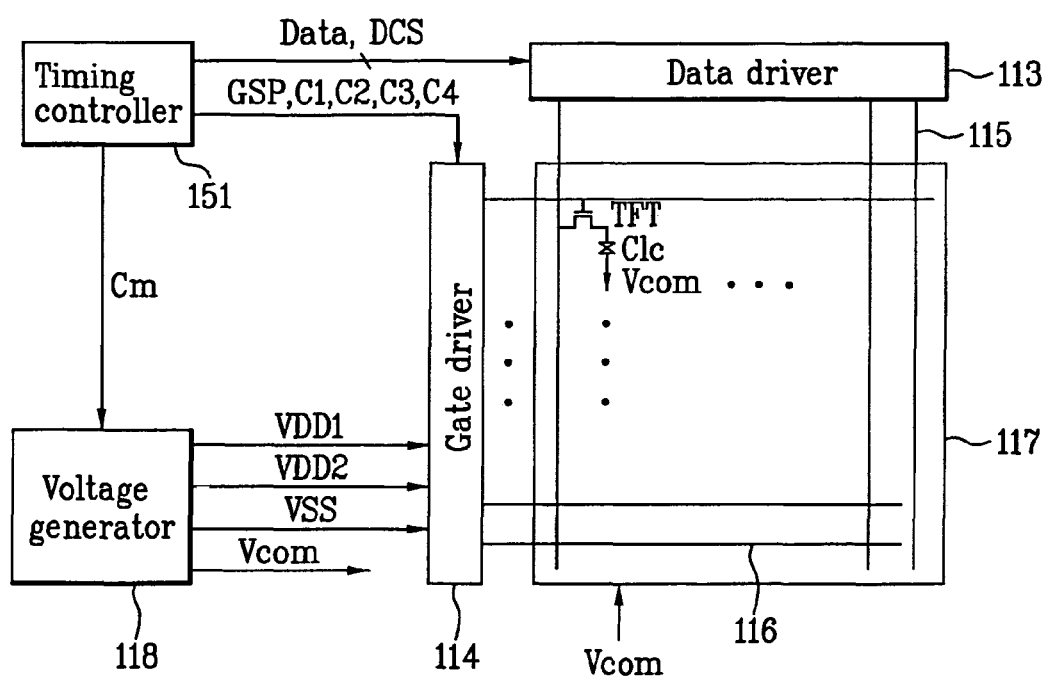
FIG. 5 is a schematic view of showing an LCD device according to a preferred embodiment of the present invention.
Figure 6:
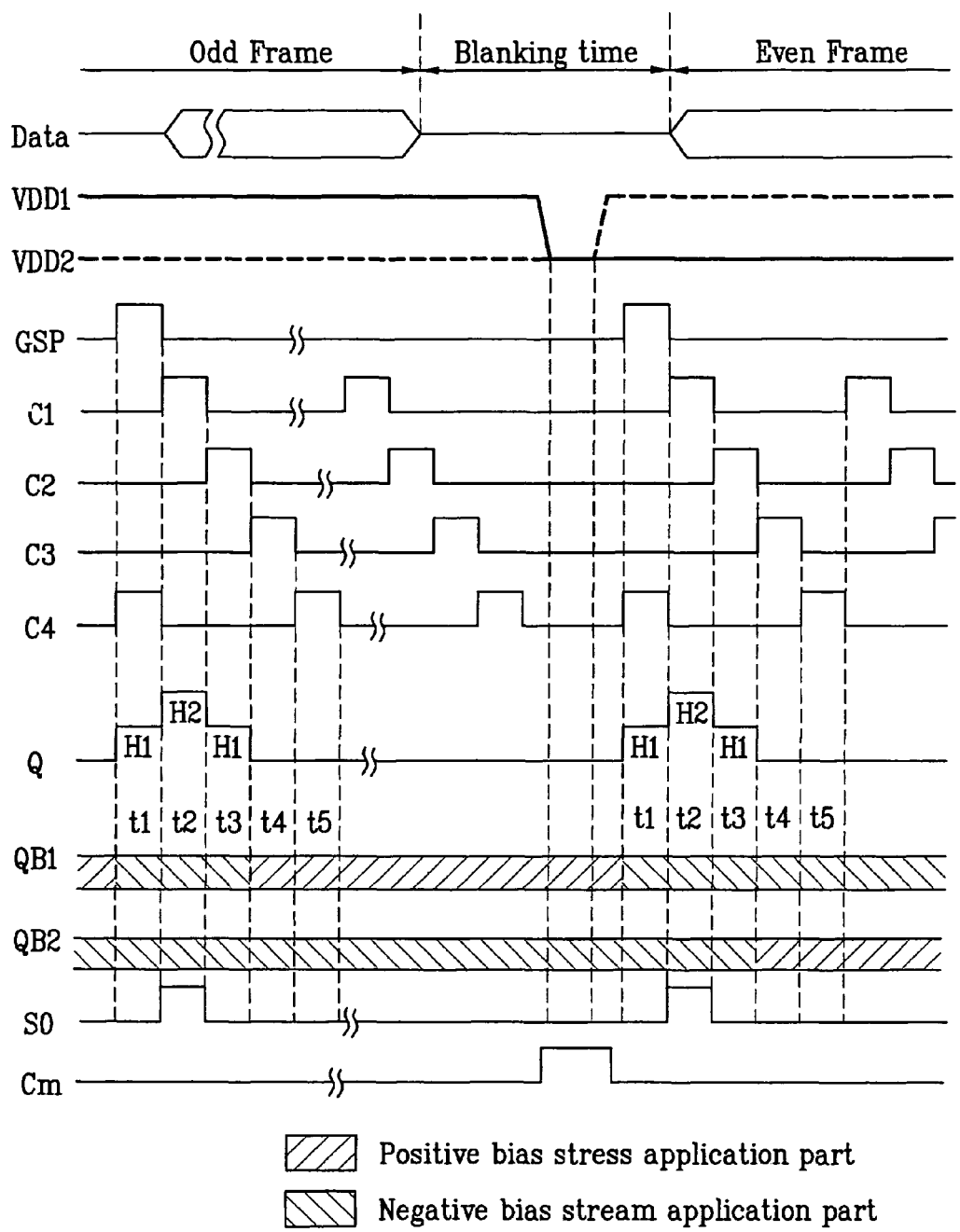
FIG. 6 is a waveform view of a gate driver shown in FIG. 5.

FIG. 5 is a schematic view of showing an LCD device according to a preferred embodiment of the present invention. FIG. 6 is a waveform view of a gate driver shown in FIG. 5.

As shown in FIG. 5 and FIG. 6, an LCD device according to a preferred embodiment of the present invention includes an LCD panel 117, a data driver 113, a gate driver 114, a timing controller 151, and a voltage generator 118.

The LCD panel includes a plurality of gate and data lines, wherein each of the gate lines 116 are perpendicular to each of the data lines 115, to define a plurality of pixel regions which are provided with liquid crystal cells Clc. The data driver 113 supplies data to the data lines 115. The gate driver 114 generates scan pulses supplied to the gate lines 116 during frames, but not a blanking block between the frames. The timing controller 151 generates a clock mask signal Cm corresponding with the blanking block, and controls the data driver 113 and the gate driver 114. Also, the voltage generator 118 inverses first and second supplying voltage VDD1 and VDD2 according to the clock mask signal Cm, and then supplies the inversed first and second supplying voltages VDD1 and VDD2 to the gate driver 118.

The LCD panel 117 is comprised of lower and upper glass substrates facing each other, and a liquid crystal layer formed between the lower and upper glass substrates. On the lower glass substrates, the gate lines 116 are formed in perpendicular to the data lines 115. Also, thin film transistors are formed at respective intersections of the gate and data lines. The thin film transistors supply data of the data lines 115 to the liquid crystal cells Clc in response to the scan pulses supplied to the gate lines 116. For this, a gate electrode of the thin film transistor is connected with the gate line 116, and a source electrode of the thin film transistor is connected with the data line 115. Also, a drain electrode of the thin film transistor is connected with the pixel electrode of the liquid crystal cell Clc.

Although not shown, the timing controller 151 re-aligns digital data outputted from a digital video card, and supplies the re-aligned digital data to the data driver 113. Also, the timing controller 151 generates a data control signal DCS for controlling the data driver 113 with horizontally and vertically synchronized signals H and V (not shown), and the data control signal DCS. In addition, the timing controller 151 generates the clock mask signal Cm in correspondence with the blanking time between the frames using horizontally and vertically synchronized signals H and V, and then supplies the clock mask signal Cm to the voltage generator 118. The clock mask signal Cm has a first logic state at one period of the blanking time, and also has a second logic state at the remaining period of the blanking time, wherein the second logic state is different from the first logic state. The clock mask signal Cm of the first logic state may be generated at least once per frame.

The timing controller 151 generates gate control signals including a gate start pulse GSP, first to fourth clock signals C1 to C4 for controlling the gate driver 114 using the horizontally and vertically synchronized signals H and V. Each of the first to fourth clock signals C1 to C4 is phase-delayed by one clock cycle in the first logic state, whereby the first to fourth clock signals C1 to C4 are supplied in the order of C4, C1, C2 and C3 through the input lines. Also, the gate start pulse GSP, provided by each frame, is supplied in synchronization with the fourth clock signal C4. The timing controller 151 prevents the first to fourth clock signals C1 to C4 supplied to the gate driver 114 during the period of the first logic state of the clock mask signal Cm generated in the timing controller 151. That is, the timing controller 151 stops the operation of the gate driver 114 during the period of the first logic state of the clock mask signal Cm. However, the timing controller 151 generates the first to fourth clock signals C1 to C4 during the period of the second logic state, and then supplies the first to fourth clock signals C1 to C4 to the gate driver 114.

The voltage generator 118 generates all the voltages for operating the LCD device including the timing controller 151, the gate driver 114 and the data driver 113. Also, the voltage generator 118 generates the first and second supplying voltages VDD1 and VDD2 which are different from each other. Further, the voltage generator 118 inverses and provides the generated first and second supplying voltages VDD1 and VDD2 according to the clock mask signal Cm supplied from the timing controller 151. The voltage generator 118 generates the third supplying voltage VSS which is different from the first and second supplying voltages VDD1 and VDD2, and then supplies the generated third supplying voltage to the gate driver 114. Also, the voltage generator 118 generates the common voltage Vcom, and supplies the generated common voltage to the LCD panel 117.

The data driver 113 samples the data supplied from the timing controller 151 according to the data control signal DCS, and latches the sampled data by each one line, and then converts the latched data to analog data corresponding to positive and negative gamma voltages. Then, the data driver 113 supplies the analog data, which is converted according to the data control signal DCS supplied from the timing controller 151, to the data lines 115 of the LCD panel 117.

The gate driver 114 includes a shift register and a level shifter. The shift register of the gate driver 114 sequentially generates scan pulses, that is, gate high pulses, according to the gate start pulse GSP and the first to fourth clock signals C1 to C4. The level shifter shifts the voltage of scan pulse to be suitable for operating the liquid crystal cell Clc. In response to the scan pulse, the thin film transistor TFT is turned-on. When the thin film transistor is turned-on, the analog data of the data line 115 is supplied to the pixel electrode of the liquid crystal cell Clc. The gate driver 114 stops the operation during some sections of the blanking time according to the first to fourth clocks C1 to C4 supplied in the second logic state from the timing controller 151.

Figure 7:
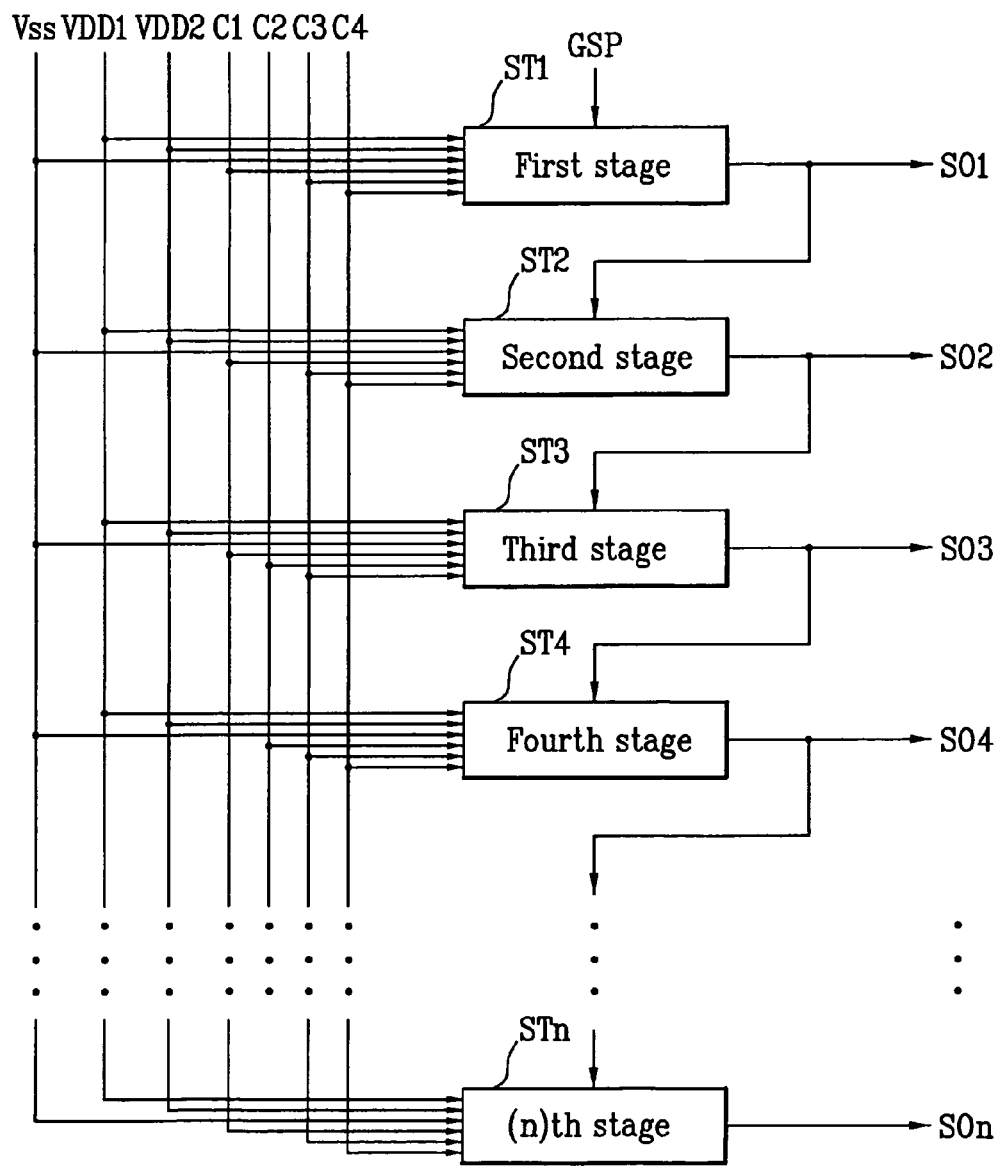
FIG. 7 is a schematic view showing a shift register according to a first embodiment of the present invention.

FIG. 7 is the schematic view showing the shift register 120 of the gate driver 114 shown in FIG. 5. Referring to FIG. 7, the shift register 120 according to a first embodiment of the present invention is comprised of 'n' stages ST1 to STn which are connected with gate start pulse input lines, for receiving three clock signals among four clock signals C1 to C4 and the first to third supplying voltages VDD1, VDD2, and VSS outputted from the voltage generator 118.

The first stage ST1 outputs a first output signal S01 using the gate start pulse GSP and three clock signals among the four clock signals C1 to C4, such as C1, C3, and C4. Then, the second to n-th stages ST2 to STn respectively output second to n-th output signals S02 to S0n using the output signal S01 to S0n−1) outputted from each prior stage ST1 to ST(n−1) and three clock signals among the four clock signals C1 to C4. That is, the first to n-th stages ST1 to STn sequentially output the first to n-th output signals S01 to S0n of which phases are shifted.

The first to n-th output signals S01 to S0n may be used with the scan pulses for sequentially driving the gate lines 116 of the LCD panel 117, or may be used with the sampling signals for sequentially sampling digital data of the data driver 113.

Figure 8:
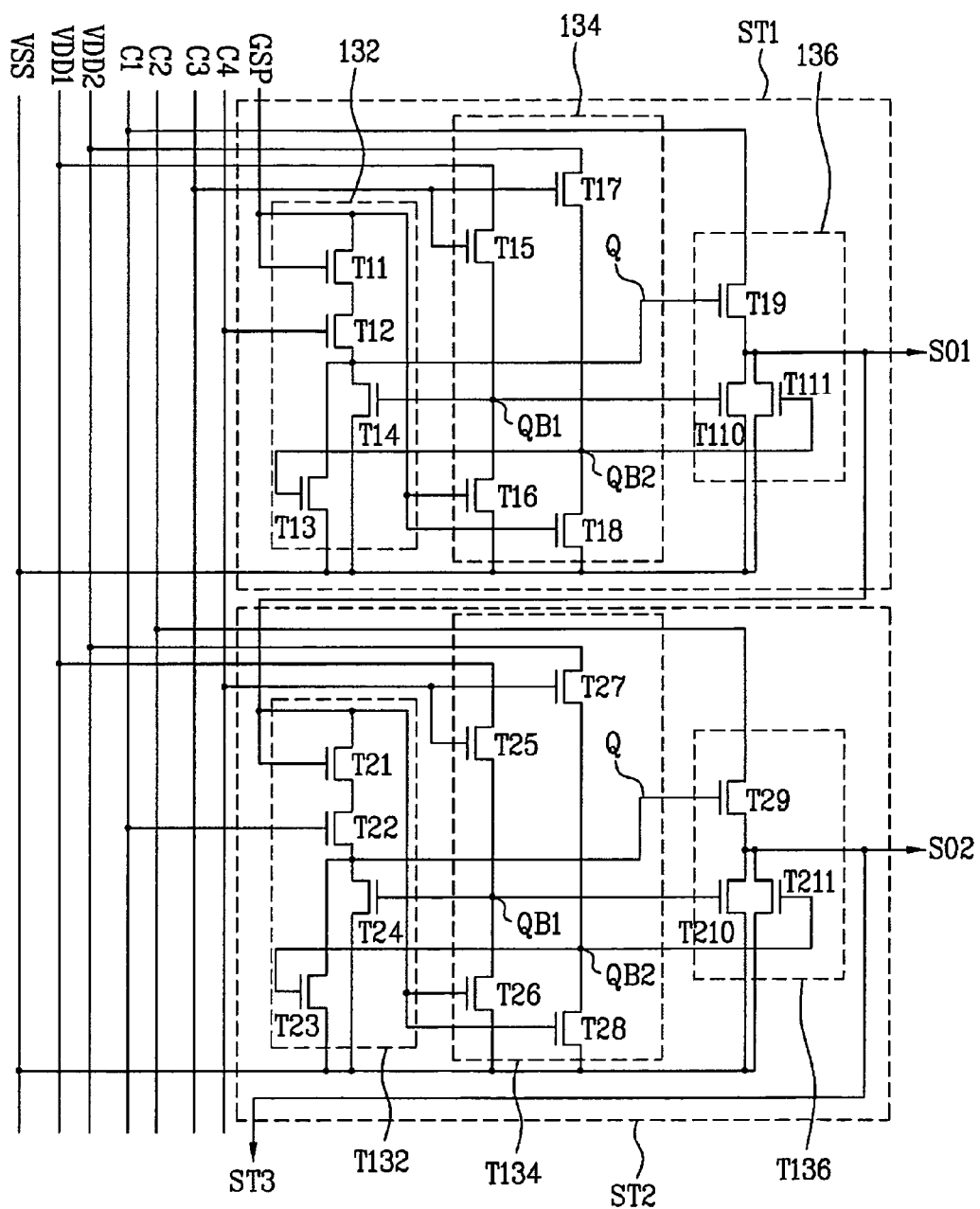
FIG. 8 is a schematic view of first and second stages in a shift register shown in FIG. 7.

FIG. 8 is a detailed circuit view of the first and second stages ST1 and ST2 among 'n' stages shown in FIG. 7.

Referring to FIG. 8, the first stage ST1 includes a first controller 132, a second controller 134, and an output buffer 136. At this time, the first controller 132 controls a first node Q according to the gate start pulse GSP and the fourth clock signal C4. Then, the second controller 134 controls a second node QB1 and a third node QB2 according to first and second supplying voltages VDD1 and VDD2 using the third clock signal C3 and the gate start pulse GSP. Also, the output buffer 136 selectively outputs any one of the first clock signal C1 and a third supplying voltage VSS according to the voltages of the first, second and third nodes Q, QB1 and QB2.

The first controller 132 includes a first transistor T11, a second transistor T12, a third transistor T13, and a fourth transistor T14. The first transistor T11 of a diode type is connected with the gate start pulse GSP input line. The second transistor T12 is connected with the first transistor T11, the fourth clock signal C4 input line, and the first node Q. The third transistor T13 is connected with the first node Q, the third supplying voltage VSS input line, and the third node QB2. The fourth transistor T14 is connected with the first node Q, the third supplying voltage VSS input line, and the second node QB1.

The second controller 134 includes a fifth transistor T15, a sixth transistor T16, a seventh transistor T17, and an eighth transistor T18. The fifth transistor is connected with the first supplying voltage VDD1 input line, the third clock signal C3 input line, and the second node QB1. The sixth transistor T16 is connected with the second node QB1, the gate start pulse GSP input line, and the third supplying voltage VSS input line. The seventh transistor T17 is connected with the second supplying voltage VDD2 input line, the third clock signal C3 input line, and the third node QB2. The eighth transistor T18 is connected with the third node QB2, the gate start pulse GSP input line, and the third supplying voltage VSS input line.

The output buffer 136 includes a ninth transistor T19, a tenth transistor T110, and an eleventh transistor T111. The ninth transistor T19 selects the first clock signal C1 according to the voltage of the first node Q, and supplies the selected signal to the output line. The tenth transistor T110 selects the third supplying voltage VSS according to the voltage of the second node QB1, and supplies the selected voltage to the output line. Then, the eleventh transistor T111 selects the third supplying voltage VSS according to the voltage of the third node QB2, and supplies the selected voltage to the output line. In this case, the tenth transistor T110 operates in a dual mode with the fourth transistor T14 of the first controller 132 according to the voltage of the second node QB1. The eleventh transistor T111 operates in a dual mode with the third transistor T13 of the first controller 132 according to the voltage of the third node QB2.

An operation of the first stage ST1 is described with reference to FIG. 6. In FIG. 6, the first to fourth clock signals C1 to C4 as well as the gate start pulse GSP are provided in a positive type having a swing voltage above 10V, preferably, 25V. For convenience of this explanation, it will be assumed that a potential of 17V is a high state, and a potential of −8V is a low state. Also, the third supplying voltage VSS supplied to the first stage ST1 is about −8V, the first supplying voltage VDD1 is in the high stage of about 17V, and the second supplying voltage VDD2 is in the low state of about −8V. In this state, the first and second supplying voltages VDD1 and VDD2 have the voltages of the opposite phases since the voltage generator 118 inverses the phases of the first and second supplying voltages VDD1 and VDD2 by each frame according to the clock mask signal Cm.

During a period of 't1' of an odd-numbered frame, the gate start pulse GSP and the fourth clock signal C4 are in the high state, and the first and second transistors T11 and T12 are turned-on, whereby the first node Q is a first high state H1. Accordingly, the ninth transistor T19 having a gate terminal connected with the first node Q is turned-on slowly. Also, the sixth and eighth transistors T16 and T18 are turned-on by the gate start pulse GSP of the high state, so that the third supplying voltage VSS is supplied to the second node QB1 and the third node QB2. Thus, the fourth and tenth transistors T14 and T110 having gate terminals connected with the second node QB1 are turned-off, and also the third and eleventh transistors T13 and T111 having gate terminals connected with the third node QB2 are turned-off. That is, during the period of 't1', the first clock signal C1 of the low state is supplied to the output line of the first stage ST1 through the ninth transistor T19.

During the period of 't2' of an odd-numbered frame, the gate start pulse GSP and the fourth clock signal C4 are in the low state, and the first clock signal C1 is in the high state, whereby the first and second transistors T11 and T12 are turned-off, and the ninth transistor T19 is turned-on.

The first node Q is in a floating state as the first and second transistors T11 and T12 are turned-off. Thus, the first node Q is bootstrapping according to the first clock signal C1 of the high state by a parasitic capacitance Cgs generated between gate and source of the ninth transistor T19. Thus, the first node Q is in a second high state H2, wherein the second high state H2 is higher than the first high state H1, whereby the ninth transistor T19 is turned-on accordingly. As the ninth transistor T19 is turned-on, the first clock signal C1 of the high state is supplied to the output line of the first stage ST1. That is, the first stage ST1 outputs the output signal S01 of the high state.

During a period 't3' of an odd-numbered frame, the first clock signal C1 is in the low state, and the second clock signal C2 is in the high state. The voltage of the first node Q, which is in the floating state, is transited to the first high state Hi, and the ninth transistor T19 is maintained in the turn-on state. Accordingly, the first stage ST1 outputs the first clock signal C1 of the low state as the output signal S01 through the turned-on ninth transistor T19.

During a period of 't4' of an odd-numbered frame, the third clock signal C3 is in the high state, whereby the fifth and seventh transistors T15 and T17 are turned-on. Thus, the first supplying voltage VDD1 of the high state is supplied to the second node QB1, and the second supplying voltage VDD2 of the low state is supplied to the third node QB2. Thus, the fourth and tenth transistors T14 and T110 are turned-on together by the first supplying voltage VDD1 of the high state supplied to the second node QB1, whereby the third supplying voltage VSS is supplied to the first node Q through the fourth transistor T14. When the third supplying voltage VSS supplied to the first node Q, the ninth transistor T19 is turned-off. Accordingly, the first stage ST1 outputs the third supplying voltage VSS as the output signal S01 through the tenth transistor T110. The third and eleventh transistors T13 and T111 are maintained in the turn-off state by the second supplying voltage VDD2 of the low state supplied to the third node QB2. Also, a negative bias stress is applied to the third and eleventh transistors T13 and T111 by the second supplying voltage VDD2 of the low state.

During a period of 't5' of an odd-numbered frame, only the fourth clock signal C4 is in the high state. Thus, the second transistor T12 is turned-on. Except the fourth and tenth transistors T14 and T110, the other transistors T11, T13, T15, T16, T17, T18, T19 and T111 are turned-off. Accordingly, the first node Q and the second node QB1 are floating. In the period of 't5', the fourth and tenth transistors T14 and T10 are turned-on in the same manner as in the period 't4', whereby the first stage ST1 outputs the third supplying voltage VSS as the output signal S01 through the tenth transistor T110.

The second stage ST2 is the same in structure as the first stage ST1. The second stage ST2 receives the output signal S01 outputted from the first stage ST1 as the gate start pulse GSP, and also receives the first, second and fourth clock signals C1, C2 and C4 among the first to fourth clock signals C1 to C4. In the same mode as the first stage ST1, the second stage ST2 outputs the output signal S02 by operating the respective transistors T21, T22, T23, T24, T25, T26, T27, T28, T29, T210 and T211. Each of the third to 'n' stages ST3 to STn receives the output signal outputted from each of the prior stages ST2 to ST(n−1) as the gate start pulse GSP, and also receives three clock signals among the four clock signals C1 to C4. That is, each of the third to 'n' stages operates in the same manner as the first stage ST1.

During the odd-numbered frame, each of 'n' stages ST1 to STn outputs the output signal SO using three clock signals among the first to fourth clock signals C1 to C4, the first supplying voltage VDD1 of the high stage, and the second supplying voltage VDD2 of the low state.

To maintain the low state in the output lines of the respective stages ST1 to STn during the odd-numbered frame, the positive bias stress is applied to the fourth and tenth transistors (Ti4 and Ti10: 'i' is a positive number from 1 to 'n') operated in the dual mode by the first supplying voltage VDD1 of the high state. Likewise, the negative bias stress is applied to the third and eleventh transistors (Ti3 and Ti11 by the second supplying voltage VSS2 of the low state.

After outputting the signal from each of 'n' stages ST1 to STn, the first to fourth clock signals C1 to C4 are in the low state by the clock mask signal Cm in some period of the blanking time which corresponds to the interval between the frames, whereby it is possible to prevent the bias stress from being applied to the respective transistors T. In the shift register and the LCD device according to a preferred embodiment of the present invention, it is possible to prevent the bias stress from being applied to the transistor by the continuous logic change of the clock signals C1 to C4, and to prevent the transistor from being deteriorated.

During some sections of the blanking time, the first supplying voltage VDD1 of the high state, supplied to the shift register 120, is inversed to the low state, and the second supplying voltage VDD2 of the low state is inversed to the high state.

The signals in the periods of 't1', 't2' and 't3' of the even-numbered frames are outputted in the same method as the signals in the periods of 't1', 't2' and 't3' of the odd-numbered frames.

During a period of 't4' of an even-numbered frame, the third clock signal C3 is in the high state, and the fifth and seventh transistors T15 and T17 are turned-on. Thus, the first supplying voltage VDD1 of the low state is supplied to the second node QB1, and the second supplying voltage of the high state is supplied to the third node QB2. Thus, the third and eleventh transistors T13 and T111 are turned-on at the same time by the second supplying voltage VDD2 of the high state, which is supplied to the third node QB2. As a result, the third supplying voltage VSS is supplied to the first node Q through the third transistor T13. By the third supplying voltage VSS supplied to the first node Q, the ninth transistor T19 is turned-off. Accordingly, the first stage ST1 outputs the third supplying voltage VSS as the output signal S01 through the eleventh transistor T111. At this time, the fourth and tenth transistors T14 and T110 are maintained in the turn-off state by the first supplying voltage VDD1 of the low state which is supplied to the second node QB1, and the negative bias stress is applied to the fourth and tenth transistors T14 and T110 by the first supplying voltage VDD1.

During a period of 't5' of an even-numbered frame, only the fourth clock signal C4 is in the high state, whereby the second transistor T12 is turned-on, and the other transistors T11, T14, T15, T16, T17, T18, T19 and T110 except the third and eleventh transistors T13 and t111 are maintained in the turned-off state. Accordingly, the first node Q and the third node QB2 are floating. In the period of 't5', the third and eleventh transistors T13 and T111 are turned-on. That is, the first stage ST1 outputs the third supplying voltage VSS as the output signal S01 through the eleventh transistor T111.

The second stage ST2 is the same in structure as the first stage ST1. The second stage ST2 receives the output signal S01 outputted from the first stage ST1 as the gate start pulse GSP, and also receives the first, second and fourth clock signals C1, C2 and C4 among the first to fourth clock signals C1 to C4. In the same mode as the first stage ST1, the second stage ST2 outputs the output signal S02 by operating the respective transistors T21, T22, T23, T24, T25, T26, T27, T28, T29, T210 and T211. Also, each of the third to 'n' stages ST3 to STn receives the output signal outputted from each of the prior stages ST2 to ST(n−1) as the gate start pulse GSP, and also receives the three clock signals among the four clock signals C1 to C4. That is, each of the third to 'n' stages operates in the same manner as the first stage ST1.

During the even-numbered frame, each of 'n' stages ST1 to STn outputs the output signal S0 using three clock signals among the first to fourth clock signals C1 to C4, the first supplying voltage VDD1 of the low stage, and the second supplying voltage VDD2 of the high state.

To maintain the low state in the output lines of the respective stages ST1 to STn during the even-numbered frame, the negative bias stress is applied to the fourth and tenth transistors (Ti4 and Ti10: 'i' is a positive number from 1 to 'n') operated in the dual mode by the first supplying voltage VDD1 of the low state. Meanwhile, the positive bias stress is applied to the third and eleventh transistors (Ti3 and Ti11 by the second supplying voltage VSS2 of the high state.

In the shift register and the LCD device according to a first embodiment of the present invention, the first and second supplying voltages VDD1 and VDD2 are inversed in the blanking time, and the logic change of the clock signals C1, C2, C3 and C4 is prevented. Accordingly, the positive and negative bias stresses are alternately applied to the third and eleventh transistors Ti3 and Ti11 (or the fourth and tenth transistors Ti4 and Ti10) for each frame. Accordingly, it is possible to prevent the third and eleventh transistors Ti3 and Ti11 (or the fourth and tenth transistors Ti4 and Ti10) from being deteriorated due to the bias stress, and to prevent the stress generated by the logic change of the clock signals C1, C2, C3 and C4.

Figure 9:
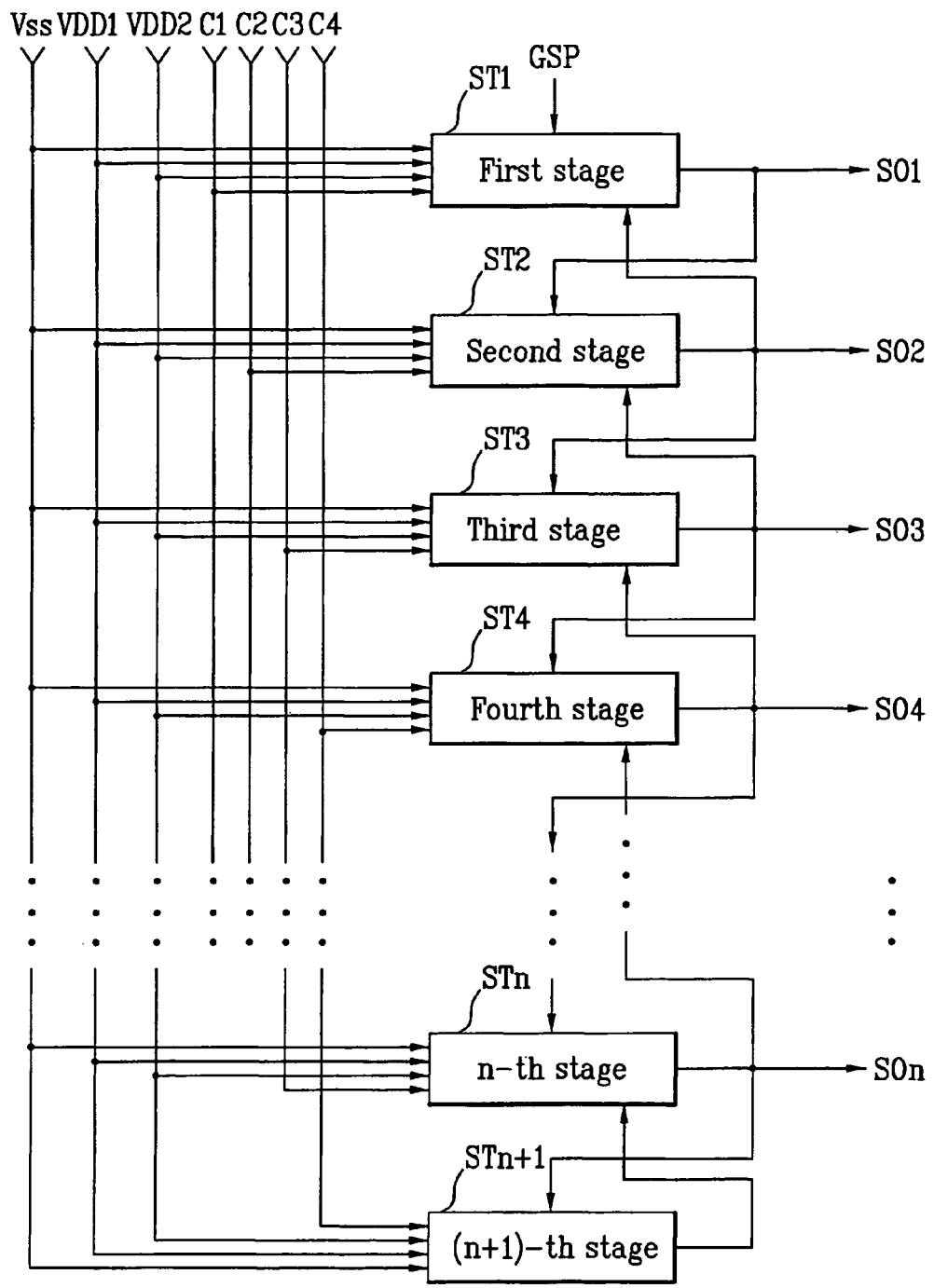
FIG. 9 is a schematic view of showing a shift register according to a second embodiment of the present invention.

FIG. 9 is a schematic view showing a shift register according to a second embodiment of the present invention. Referring to FIG. 9, a shift register according to a second embodiment of the present invention is comprised of 'n+1' stages ST1 to STn+1 connected with gate start pulse input lines, wherein the stage receives one clock signal among first to fourth clock signals C1 to C4, and first to third supplying voltage VDD1, VDD2 and VSS generated from a voltage generator 118.

The first stage ST1 outputs a first output signal S01 using a gate start pulse GSP, an output signal S02 outputted from the second stage ST2, and one clock signal among the first to fourth clock signals C1 to C4. Also, the second to n-th stages ST2 to STn respectively output second to n-th output signals S02 to S0n using output signals S01 to S0n−1 outputted from the preceding stages ST1 to ST(n−1), output signals S03 to S0(n+1) outputted from the following stages S03 to S0n+1, and one clock signal among the four clock signals C1 to C4. That is, the first to n-th stages ST1 to STn sequentially output the first to n-th output signals S01 to S0n of which phases are shifted.

The first to n-th output signals S01 to S0n may be scan pulses for sequentially driving gate lines 116 of an LCD panel 117, or may be sampling signals for sequentially sampling digital data of a data driver 113.

Figure 10:
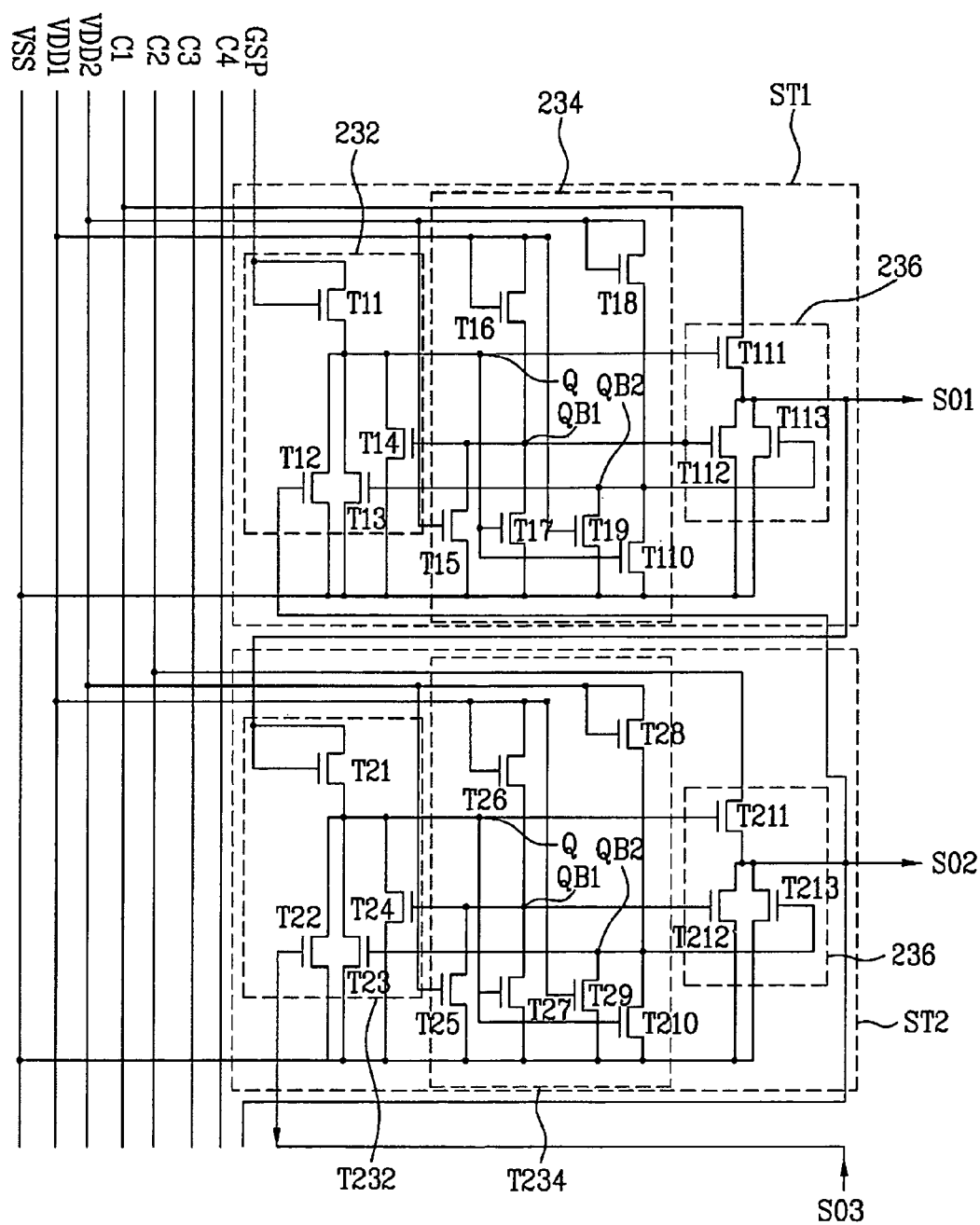
FIG. 10 is a circuit view of first and second stages shown in FIG. 9.

FIG. 10 is a detailed circuit view of the first and second stages ST1 and ST2 among 'n' stages shown in FIG. 9.

Referring to FIG. 10, the first stage ST1 includes a first controller 232, a second controller 234, and an output buffer 236. The first controller 232 controls a first node Q according to the gate start pulse GSP and the output signal S02 outputted from the second stage ST2. Then, the second controller 234 controls a second node QB1 and a third node QB2 according to a voltage of the first node Q and first and second supplying voltages VDD1 and VDD2. The output buffer 236 selectively outputs any one of the first clock signal C1 and a third supplying voltage VSS to an output line according to the voltages of the first, second and third nodes Q, QB1 and QB2.

The first controller 232 includes a first transistor T11, a second transistor T12, a third transistor T13, and a fourth transistor T14. In detail, the first transistor T11 of a diode type is connected with the gate start pulse GSP input line. The second transistor T12 is connected with the first node Q, a third supplying voltage VSS input line, and an output signal S02 input line of the second stage ST2. The third transistor T13 is connected with the first node Q, the third supplying voltage VSS input line, and the third node QB2. Then, the fourth transistor T14 is connected with the first node Q, the third supplying voltage VSS input line, and the second node QB1.

The second controller 234 includes a fifth transistor T15, a sixth transistor T16, a seventh transistor T17, an eighth transistor T18, a ninth transistor T19, and a tenth transistor T110. At this time, the fifth transistor T15 is connected with the second node QB1, the third supplying voltage VSS input line, and a second supplying voltage VDD2 input line. The sixth transistor T16 is connected with the first supplying voltage VDD1 input line in a diode type, and is also connected with the second node QB1. The seventh transistor T17 is connected with the second node QB1, the third supplying voltage VSS input line, and the first node Q. The eighth transistor T18 is connected with the second supplying voltage VDD2 input line in a diode type, and is also connected with the third node QB2. The ninth transistor T19 is connected with the third node QB2, the third supplying voltage VSS input line, and the first supplying voltage VDD1 input line. The tenth transistor T110 is connected with the third node QB2, the third supplying voltage VSS input line, and the first node Q.

The output buffer 236 includes an eleventh transistor T111, a twelfth transistor T112, and a thirteenth transistor T113. The eleventh transistor T111 selectively supplies the first clock signal C1 to the output line according to the voltage of the first node Q. The twelfth transistor T112 selectively supplies the third supplying voltage VSS to the output line according to the voltage of the second node QB1. The thirteenth transistor T113 selectively supplies the third supplying voltage VSS to the output line according to the voltage of the third node QB2.

The twelfth transistor T112 is operated in a dual mode with the fourth transistor T14 of the first controller 232 according to the voltage of the second node QB1. The thirteenth transistor T113 is operated in a dual mode with the third transistor T13 of the first controller 232 according to the voltage of the third node QB2.

Figure 11:
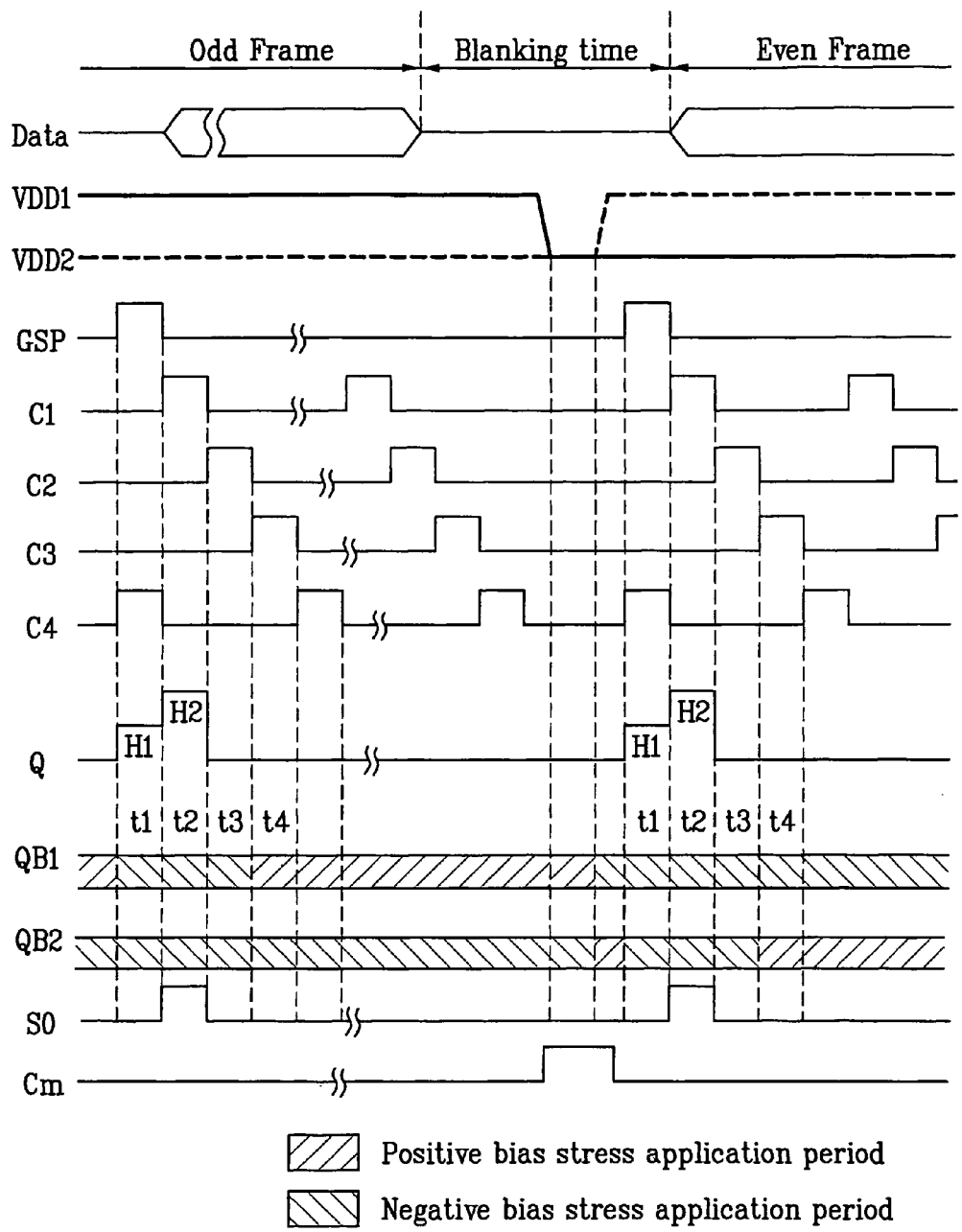
FIG. 11 is a waveform view of operating respective stages shown in FIG. 10.

FIG. 11 is a waveform view of operating respective stages shown in FIG. 10.

An operation of the stage will be described with reference to FIG. 10 and FIG. 11. In FIG. 11, the first to fourth clock signals C1 to C4 as well as the gate start pulse GSP are provided in a positive type having a swing voltage above 10V, preferably, 25V. For convenience of explanation, it will be assumed that a potential of 17V is a high state, and a potential of −8V is a low state. Also, the third supplying voltage VSS supplied to the first stage ST1 is about −8V, the first supplying voltage VDD1 is in the high stage of about 17V, and the second supplying voltage VDD2 is in the low state of about −8V. In this state, the first and second supplying voltages VDD1 and VDD2 have the voltages of the opposite phases since a voltage generator 118 inverses the phases of the first and second supplying voltages VDD1 and VDD2 by each frame according to a clock mask signal Cm.

In the odd-numbered frame, the sixth and ninth transistors T16 and T19 are maintained in the turn-on state by the first supplying voltage VDD1 of the high state. Thus, the first supplying voltage VDD1 of the high state is supplied to the second node QB1, and the third supplying voltage VSS of the low state is supplied to the third node QB2. Accordingly, the fourth and twelfth transistors T14 and T112 are turned-on by the voltage of the second node QB1, whereby the third supplying voltage VSS is supplied to the first node Q.

During a period of 't1' of the odd-numbered frame, the gate start pulse GSP and the fourth clock signal C4 are in the high state, whereby the first transistor T11 is turned-on, and the first node Q is in a first high state H1. At this time, since the gate start pulse GSP, which is higher than the third supplying voltage VSS, is provided to the first node Q, the first node Q is in the first high state H1 by charging the gate start pulse GSP. Accordingly, as the first node Q is charged with the voltage of the first high state Hi, the seventh and tenth transistors T17 and T110 are turned-on. The third supplying voltage VSS is then supplied to the second node QB1 and the third node QB2, whereby the fourth and twelfth transistors T14 and T112 are turned-off, and the third and thirteenth transistors T13 and T113 are maintained in the turn-off state. In the period of 't1', the first clock signal C1 of the low state is supplied to the output line of the first stage ST1 through the eleventh transistor T111.

During a period of 't2' of the odd-numbered frame, the gate start pulse GSP and the fourth clock signal C4 are in the low state, and the first clock signal C1 is in the high state. Thus, the first transistor T11 is turned-off, and the eleventh transistor T111 is turned-on certainly. That is, since the first transistor T11 is turned-off, the first node Q is in a floating state. Thus, the first node Q is bootstrapping according to the high-state voltage of the first clock signal C1 due to a parasitic capacitance Cgs generated between gate and source of the eleventh transistor T111, whereby the first node Q is in a second high state H2, wherein the second high state H2 is higher than the first high state H1. As a result, the eleventh transistor T111 is turned-on. As the eleventh transistor T111 is turned-on, the first clock signal C1 of the high state is supplied to the output line of the first stage ST1. Accordingly, the first stage ST1 outputs the output signal S01 of the high state. The second stage ST2 then charges the first node Q by the output signal S01 of the high state outputted from the first stage ST1 during the period of 't2'.

During a period of 't3' of the odd-numbered frame, the first clock signal C1 is in the low state, and the second clock signal C2 is in the high state. Thus, the second transistor T12 of the first stage ST1 is turned-on according to the output signal of the high state supplied through the output signal S02 input line of the second stage ST2. Accordingly, as the second transistor T12 is turned-on, the third supplying voltage VSS is supplied to the first node Q, and the eleventh transistor T111 is turned-off. The third supplying voltage VSS is supplied to the first node Q, whereby the seventh and tenth transistors T17 and T110 are turned-off. Thus, the first supplying voltage VDD1 of the high state is supplied to the second node QB1, and the third supplying voltage VSS is supplied to the third node QB2. Also, the fourth and twelfth transistors T14 and T112 are turned-on by the first supplying voltage VDD1 of the high state supplied to the second node QB1, whereby the first stage ST1 outputs the third supplying voltage as the output signal S01 through the twelfth transistor T12. In this case, the second stage ST2 outputs the second clock signal C2 of the high state as the output signal S02.

During a period of 't4' of the odd-numbered frame, the third clock signal C3 is in the high state, whereby the fourth, sixth, ninth and twelfth transistors T14, T16, T19 and T112 are maintained in the turn-on state. Thus, the first stage ST1 outputs the third supplying voltage VSS as the output signal S01.

The second stage ST2 is the same in structure as the first stage ST1. The second stage ST2 receives the output signal S01 outputted from the first stage ST1, an output signal S03 outputted from the third stage ST3, and the second clock signal C2. In the same mode as the first stage ST1, the second stage ST2 outputs the output signal S02 by operating the respective transistors T21, T22, T23, T24, T25, T26, T27, T28, T29, T210, T211, T212 and T213.

During the odd-numbered frame, each of the 'n' stages ST1 to STn outputs an output signal SO using one clock signal among the first to fourth clock signals C1 to C4, the output signal outputted from the following stage, the first supplying voltage VDD1 of the high state, and the second supplying voltage VDD2 of the low state. To maintain the low state in the output lines of the respective stages ST1 to STn during the odd-numbered frame, the positive bias stress is applied to the fourth and twelfth transistors (Ti4 and Ti12: 'i' is a positive number from 1 to 'n') operated in the dual mode by the first supplying voltage VDD1 of the high state. Meanwhile, a negative bias stress is applied to the third and thirteenth transistors (Ti3 and Ti13) by the second supplying voltage VSS2 of the low state.

After outputting the signal from each of 'n' stages ST1 to STn, the first to fourth clock signals C1 to C4 are in the low state by the clock mask signal Cm in some period of the blanking time which corresponds to the interval between the frames, whereby it is possible to prevent the bias stress from being applied to the respective transistors T. In the shift register and the LCD device according to the second embodiment of the present invention, it is possible to prevent the bias stress from being applied to the transistor by the continuous logic change of the clock signals C1 to C4, and to prevent the transistor from being deteriorated.

During some sections of the blanking time, the first supplying voltage VDD1 of the high state, supplied to the shift register 220, is inversed to the low state, and the second supplying voltage VDD2 of the low state is inversed to the high state.

In the even-numbered frame, the fifth and eighth transistors T15 and T18 are maintained in the turn-on state by the second supplying voltage VDD2 of the high state. Thus, the third supplying voltage VSS of the low state is supplied to the second node QB1, and the second supplying voltage VDD2 of the high state is supplied to the third node QB2. Accordingly, the third and thirteenth transistors T13 and T113 are turned-on by the voltage of the third node QB2, whereby the third supplying voltage VSS is supplied to the first node Q.

During a period of 't1' of an even-numbered frame, the gate start pulse GSP and the fourth clock signal C4 are in the high state, whereby the first transistor T11 is turned-on, and the first node Q is in a first high state H1. At this time, since the gate start pulse GSP, which is higher than the third supplying voltage VSS, is provided to the first node Q, the first node Q is in the first high state H1 by charging the gate start pulse GSP. Accordingly, as the first node Q is charged with the voltage of the first high state H1, the seventh and tenth transistors T17 and T110 are turned-on. The third supplying voltage VSS is supplied to the second node QB1 and the third node QB2, whereby the fourth and twelfth transistors T14 and T112 are turned-off, and the third and thirteenth transistors T13 and T113 are maintained in the turn-off state. In the period of 't1', the first clock signal C1 of the low state is supplied to the output line of the first stage ST1 through the eleventh transistor T111.

During a period of 't2' of the even-numbered frame, the gate start pulse GSP and the fourth clock signal C4 are in the low state, and the first clock signal C1 is in the high state. Thus, the first transistor T11 is turned-off, and the eleventh transistor T111 is turned-on. Since the first transistor T11 is turned-off, the first node Q is in a floating state. Thus, the first node Q is bootstrapping according to the high-state voltage of the first clock signal C1 due to a parasitic capacitance Cgs generated between gate and source of the eleventh transistor T111, whereby the first node Q is in a second high state H2, wherein the second high state H2 is higher than the first high state H1. As a result, the eleventh transistor T111 is turned-on. As the eleventh transistor T111 is turned-on, the first clock signal C1 of the high state is supplied to the output line of the first stage ST1. Accordingly, the first stage ST1 outputs the output signal S01 of the high state. The second stage ST2 charges the first node Q by the output signal S01 of the high state outputted from the first stage ST1 during the period of 't2'.

During a period of 't3' of the even-numbered frame, the first clock signal C1 is in the low state, and the second clock signal C2 is in the high state. Thus, the second transistor T12 of the first stage ST1 is turned-on according to the output signal of the high state supplied through the output signal S02 input line of the second stage ST2. Accordingly, as the second transistor T12 is turned-on, the third supplying voltage VSS is supplied to the first node Q, and the eleventh transistor T111 is turned-off. Also, the third supplying voltage VSS is supplied to the first node Q, whereby the seventh and tenth transistors T17 and T110 are turned-off. Thus, the third supplying voltage VSS of the high state is supplied to the second node QB1, and the second supplying voltage VDD2 of the high state is supplied to the third node QB2. Also, the third and thirteenth transistors T13 and T113 are turned-on by the second supplying voltage VDD2 of the high state supplied to the third node QB2, whereby the first stage ST1 outputs the third supplying voltage VSS as the output signal S01 through the thirteenth transistor T13 which is turned-on. In this case, the second stage ST2 outputs the second clock signal C2 of the high state as the output signal S02.

During a period of 't4' of the even-numbered frame, the third clock signal C3 is in the high state, whereby the fourth, sixth, ninth and twelfth transistors T14, T16, T19 and T112 are maintained in the turn-on state. Thus, the first stage ST1 outputs the third supplying voltage VSS as the output signal S01.

The second stage ST2 is the same in structure as the first stage ST1. The second stage ST2 receives the output signal S01 outputted from the first stage ST1, an output signal S03 outputted from the third stage ST3, and the second clock signal C2. In the same mode as the first stage ST1, the second stage ST2 outputs the output signal S02 by operating the respective transistors T21, T22, T23, T24, T25, T26, T27, T28, T29, T210, T211, T212 and T213.

During the even-numbered frame, each of 'n' stages ST1 to STn outputs the output signal S0 using one clock signal among the first to fourth clock signals C1 to C4, the output signal outputted from the following stage, the first supplying voltage VDD1 of the low state, and the second supplying voltage VDD2 of the high state. To maintain the low state in the output lines of the respective stages ST1 to STn during the even-numbered frame, the negative bias stress is applied to the third and thirteenth transistors (Ti3 and Ti13: 'i' is a positive number from 1 to 'n') operated in the dual mode by the first supplying voltage VDD1 of the low state. Meanwhile, the positive bias stress is applied to the fourth and twelfth transistors (Ti4 and Ti12) by the second supplying voltage VSS2 of the high state.

In the shift register and the LCD device according to a second embodiment of the present invention, the first and second supplying voltages VDD1 and VDD2 are inversed in the blanking time, and the logic change of the clock signals C1 to C4 is prevented. Accordingly, the positive and negative bias stresses are alternately applied to the third and twelfth transistors Ti3 and Ti12 (or the fourth and thirteenth transistors Ti4 and Ti13) by each frame. Accordingly, it is possible to prevent the third and twelfth transistors Ti3 and Ti12 (or the fourth and thirteenth transistors Ti4 and Ti13) from being deteriorated due to the bias stress, and to prevent the stress generated by the logic change of the clock signals C1 to C4.

In the shift register and LCD device according to a second embodiment of the present invention, if the gate drivers 114 are positioned at both sides of the LCD panel 117, each of the stages may drive the odd-numbered gate lines or the even-numbered gate lines. Accordingly, the first stage ST1 receives the gate start pulse GSP and the output signal S03 outputted from the third stage ST3, and then the first stage ST1 operates according to the waveform of the first node Q shown in FIG. 6. Also, each of the second to 'n' stages ST2 to STn receives the output signal outputted from the preceding stage ST1 to ST(n/2+1), and the output signal outputted from the following stage ST5 to ST(n/2+2), and then each of the stages operates according to the waveform of the first node Q shown in FIG. 6.

In the shift register and LCD device according to the first and second embodiments of the present invention, the first and second supplying voltages VDD1 and VDD2 may be inversed in the blanking time by each one of the first to 'i' frames.

As mentioned above, the shift register and the LCD device according to the preferred embodiments of the present invention have the following advantages.

In the shift register and the LCD device according to the preferred embodiment of the present invention, it is possible to prevent the logic change of the clock signals supplied to the shift register in the blanking time. Thus, it is possible to prevent the bias stress from being applied to the transistor, and to minimize the deterioration of transistor.

Also, the first and second supplying voltages, which are inversed by each frame, are inversed in the blanking time, whereby the positive and negative bias stresses are alternated to the transistor by each frame. Thus, it is possible to minimize the shift in the characteristics of transistor.

In the shift register and the LCD device according to the present invention, it is possible to prevent the deterioration of a transistor, thereby stably operating the shift register, and preventing a misoperation or a decrease in the lifespan of the gate driver.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An LCD device comprising:
   an LCD panel including liquid crystal cells in pixel regions defined by a plurality of gate lines and a plurality of data lines;
   a data driver for supplying data to the data lines;
   a gate driver including a plurality of stages, wherein each of the plurality of stages, connected with a start pulse input line and at least one clock signal input line for inputting at least one clock signal that a phase of a first logic state is sequentially shifted, generates scan pulses for driving the plurality of gate lines;
   a voltage generator, which generates first and second supplying voltages having opposite phases inversed by at least every one of the frames, and a third supplying voltage different from the first and second supplying voltages, wherein the voltage generator supplies the generated supplying voltages to the gate driver; and
   a timing controller for:
      controlling the data driver and the gate driver,
      generating the at least one clock signal and outputting the at least one clock signal to the gate driver, and
      generating a clock mask signal corresponding to a blanking time and outputting the clock mask signal to the voltage generator, wherein the blanking time is a period between frames, and wherein the clock mask signal has the first logic state in some period of the blanking time, and has a second logic state in the remaining period of the blanking time and has the second logic state during the duration of the frames;

wherein the voltage generator inverses the first and second supplying voltages according to the clock mask signal.

2. The LCD device of claim 1, wherein the phases of the first and second supplying voltages are inversed in at least one section of the blanking time.

3. The LCD device of claim 1, wherein each of the stages includes:
a first controller for controlling a first node according to a start pulse and a first clock signal;
a second controller for controlling second and third nodes using the first and second supplying voltages according to the start pulse and a second clock signal; and
an output buffer for selectively outputting a third clock signal and the third supplying voltage according to the voltages of the first to third nodes.

4. The LCD device of claim 3, wherein the first controller includes:
a first transistor, connected with the start pulse input line in a diode type, for outputting the start pulse;
a second transistor, connected with the first transistor and the first node, for supplying the start pulse to the first node according to the first clock signal;
a third transistor, connected with the first node and the third supplying voltage input line, for supplying the third supplying voltage to the first node according to the voltage of the third node; and
a fourth transistor, connected with the first node and the third supplying voltage input line, for supplying the third supplying voltage to the first node according to the voltage of the second node.

5. The LCD device of claim 3, wherein the second controller includes:
a fifth transistor, connected with the first supplying voltage input line and the second node, for supplying the first supplying voltage to the second node according to the second clock signal;
a sixth transistor, connected with the second node and the third supplying voltage input line, for supplying the third supplying voltage to the second node according to the start pulse;
a seventh transistor, connected with the second supplying voltage input line and the third node, for supplying the second supplying voltage to the third node according to the second clock signal; and
an eighth transistor, connected with the third node and the third supplying voltage input line, for supplying the third supplying voltage to the third node according to the start pulse.

6. The LCD device of claim 3, wherein the output buffer includes:
a ninth transistor, connected with the third clock signal input line and the output line, for supplying the third clock signal to the output line according to the voltage of the first node;
a tenth transistor, connected with the output line and the third supplying voltage input line, for supplying the third supplying voltage to the output line according to the voltage of the second node; and
an eleventh transistor, connected with the output line and the third supplying voltage input line, for supplying the third supplying voltage to the output line according to the voltage of the third node.

7. A method for operating an LCD display comprising an LCD panel including liquid crystal cells in pixel regions defined by data lines and gate lines, the method comprising:
supplying data to the data lines from a data driver;
generating at least one clock signal that a phase of a first logic state is sequentially shifted and a clock mask signal corresponding to a blanking time, wherein the clock mask signal has the first logic state in some period of the blanking time, has a second logic state in the remaining period of the blanking time, and has the second logic state during the duration of the frames, and outputting the at least one clock signal to a gate driver and the clock mask signal to a voltage generator;
generating with the voltage generator, a first and second supplying voltages having opposite phases inversed by the clock mask signal, and a third supplying voltage different from the first and second supplying voltages, wherein the voltage generator supplies the generated supplying voltages to the gate driver;
generating scan pulses for driving the gate lines from the gate driver, the gate driver including a plurality of stages, wherein each of the plurality of stages is connected with a start pulse input line and at least one clock signal input line for inputting the at least one clock signal;
controlling the data driver and the gate driver with a timing controller; and
preventing the at least one clock signal from being supplied to the gate driver during the period of the first logic state of the clock mask signal.

8. The method of claim 7, wherein the phases of the first and second supplying voltages are inversed in at least one section of the blanking time.

9. The method of claim 7, further comprising:
controlling a first node with a first controller according to a start pulse and a first clock signal;
controlling second and third nodes with a second controller using the first and second supplying voltages according to the start pulse and a second clock signal; and
outputting a third clock signal and the third supplying voltage from an output buffer according to the voltages of the first to third nodes.

* * * * *